(12) United States Patent
Du Plessis et al.

(10) Patent No.: US 8,729,582 B2
(45) Date of Patent: May 20, 2014

(54) OPTOELECTRONIC DEVICE WITH LIGHT DIRECTING ARRANGEMENT AND METHOD OF FORMING THE ARRANGEMENT

(75) Inventors: Monuko Du Plessis, Pretoria (ZA); Ray Frederick Greyvenstein, Pretoria (ZA); Alfons Willi Bogalecki, Pretoria (ZA)

(73) Assignee: Insiava (Pty) Limited, Pretoria (ZA)

( * ) Notice: Subject to any disclaimer, the term of this patent is extended or adjusted under 35 U.S.C. 154(b) by 413 days.

(21) Appl. No.: 12/740,597

(22) PCT Filed: Oct. 31, 2008

(86) PCT No.: PCT/IB2008/054534
§ 371 (c)(1),
(2), (4) Date: Oct. 20, 2010

(87) PCT Pub. No.: WO2009/057075
PCT Pub. Date: May 7, 2009

(65) Prior Publication Data
US 2011/0042701 A1     Feb. 24, 2011

(30) Foreign Application Priority Data
Nov. 1, 2007   (ZA) .................................. 2007/09436

(51) Int. Cl.
*H01L 33/46*   (2010.01)
(52) U.S. Cl.
USPC ........................................................... 257/98
(58) Field of Classification Search
USPC ........................................................... 257/98
See application file for complete search history.

(56) References Cited

U.S. PATENT DOCUMENTS

| | | | |
|---|---|---|---|
| 5,994,720 A | 11/1999 | Snyman et al. | |
| 6,111,271 A | 8/2000 | Snyman et al. | |
| 6,861,686 B2 * | 3/2005 | Lee et al. | 257/291 |
| 7,119,319 B2 * | 10/2006 | Noto et al. | 250/208.1 |
| 7,135,666 B2 * | 11/2006 | Dobashi | 250/208.1 |
| 7,193,289 B2 * | 3/2007 | Adkisson et al. | 257/431 |
| 7,358,583 B2 * | 4/2008 | Reznik et al. | 257/432 |
| 7,442,973 B2 * | 10/2008 | Komoguchi et al. | 257/291 |
| 7,683,407 B2 * | 3/2010 | Boettiger | 257/292 |
| 8,053,855 B2 * | 11/2011 | Nam et al. | 257/432 |

(Continued)

FOREIGN PATENT DOCUMENTS

| | | |
|---|---|---|
| EP | 1 473 780 | 11/2004 |
| GB | 2 326 525 | 12/1998 |

(Continued)

OTHER PUBLICATIONS

International Preliminary Report on Patentability for PCT/IB2008/054534, completed May 21, 2010.

(Continued)

*Primary Examiner* — Eugene Lee
(74) *Attorney, Agent, or Firm* — Nixon & Vanderhye PC

(57) ABSTRACT

An optoelectronic device (20) comprises a body (14) of an indirect bandgap semiconductor material having a surface (16) and a photon active region (12) on one side of the surface. A fight directing arrangement (22) is formed integrally with the body on an opposite side of the surface.

10 Claims, 8 Drawing Sheets

(56) References Cited

U.S. PATENT DOCUMENTS

| | | |
|---|---|---|
| 8,362,679 B2 | 1/2013 | Du Plessis |
| 8,395,226 B2 | 3/2013 | Du Plessis et al. |
| 2003/0063204 A1 | 4/2003 | Suda |
| 2005/0274871 A1 | 12/2005 | Li et al. |
| 2006/0001055 A1 | 1/2006 | Ueno et al. |
| 2006/0115230 A1 | 6/2006 | Komoguchi et al. |
| 2007/0145394 A1 | 6/2007 | Shimizu et al. |
| 2007/0200054 A1 | 8/2007 | Reznik et al. |
| 2008/0079106 A1 | 4/2008 | Miyagawa et al. |
| 2011/0031893 A1 | 2/2011 | Snyman et al. |
| 2011/0068716 A1 | 3/2011 | Snyman et al. |
| 2012/0001681 A1 | 1/2012 | Du Plessis |
| 2012/0009709 A1 | 1/2012 | Du Plessis |
| 2013/0026534 A1 | 1/2013 | Venter |

FOREIGN PATENT DOCUMENTS

| | | |
|---|---|---|
| JP | 2001-267544 | 9/2001 |
| JP | 2004-221532 | 8/2004 |
| JP | 2005-322733 | 11/2005 |
| JP | 2006-005091 | 1/2006 |

OTHER PUBLICATIONS

International Search Report for PCT/IB2008/054534, mailed Feb. 2, 2010.

Snyman, Lukas W. et al., "Optical sources, integrated optical detectors and optical waveguides in standard silicon CMOS integrated circuitry", Proceedings of the SPIE—The International Society for Optical Engineering SPIE-Int., vol. 3953, (2000), pp. 20-36.

Du Plessis, M. et al., "Low-Voltage Light Emitting Devices in Silicon IC Technology", Proceedings of the IEEE International Symposium on Industrial Electronics, vol. 3, (2005), pp. 1145-1149.

U.S. Appl. No. 13/810,809 (Du Plessis et al.) filed Apr. 1, 2013.
U.S. Appl. No. 13/574,333 (Venter, Petrus Johannes) filed Jul. 20, 2012.
U.S. Appl. No. 13/161,113 (Du Plessis) filed Jun. 15, 2011.
U.S. Appl. No. 13/139,653 (Du Plessis) filed Jun. 14, 2011.
U.S. Appl. No. 12/865,609 (Snyman et al.) filed Jul. 30, 2010.
U.S. Appl. No. 12/863,743 (Snyman et al.) filed Jul. 20, 2010.
English Translation of Japanese Office Action dated Feb. 5, 2013 in corresponding Japanese Patent Application No. JP-2010-531626.

* cited by examiner

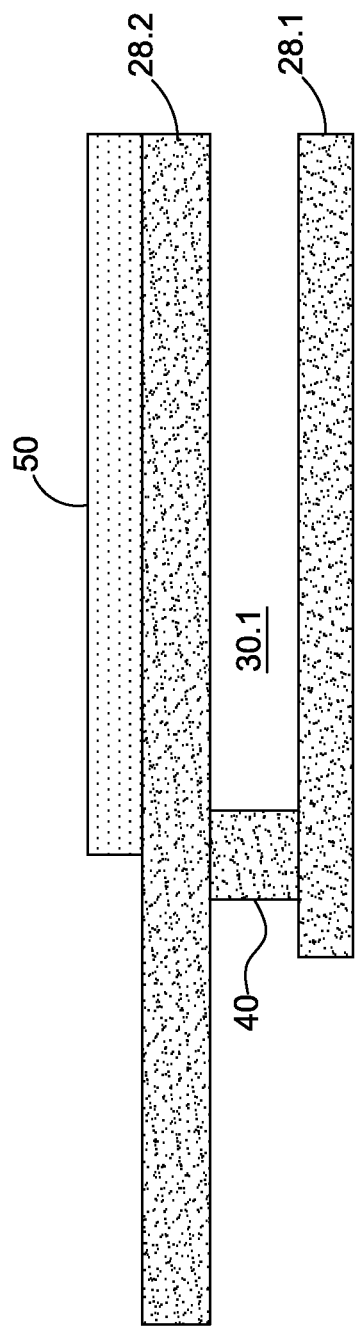
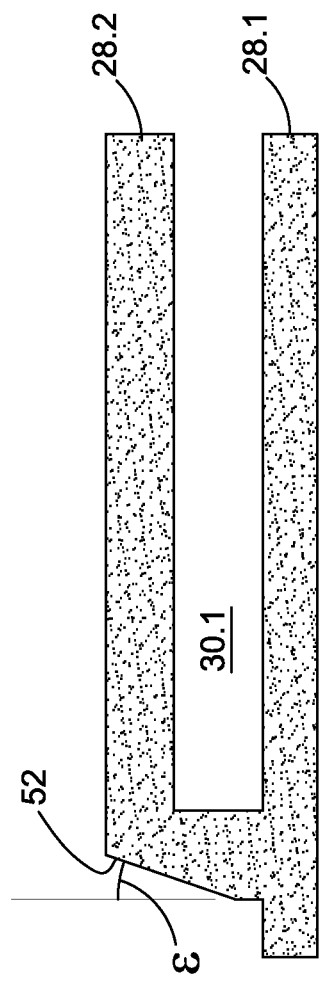
FIGURE 6(a)
FIGURE 6(b)

OPTOELECTRONIC DEVICE WITH LIGHT DIRECTING ARRANGEMENT AND METHOD OF FORMING THE ARRANGEMENT

This application is the U.S. national phase, under 35 U.S.C. §371, of International Application No. PCT/IB2008/054534, filed 31 Oct. 2008, which claims priority to South Africa Application No. 2007/09436, filed 1 Nov. 2007, the entire contents of each of which are hereby incorporated herein by reference.

INTRODUCTION AND BACKGROUND

This invention relates to optoelectronic devices and more particularly to devices comprising an arrangement to direct light. The invention also relates to a method of forming a light directing arrangement for an optoelectronic device.

One known type of light emitting device comprises a junction in a body of silicon and which junction is configured to be driven into avalanche or field emission breakdown mode thereby to emit light. A problem associated with these devices is that the critical angle of internal reflection at the silicon-oxide-air interface is determined by the refractive indexes of the materials. For silicon and air, the critical angle is only about 15.3° and taking into account the solid angles of emission, it means that only about 1.8% of the light generated by the device will leave the surface. A large proportion of this light leaves the surface of the body substantially parallel to the surface and therefore it is difficult to effectively couple this light into an input of a spaced optical fibre.

It is also known that the speed with which semiconductor pn junction diode optical detectors operate, is a function of the built-in junction capacitance. By reducing the size of the detecting pn junction, the built-in pn junction capacitance may be reduced, and the detecting diode device may operate at a higher switching frequency. However, at the same time, the sensitive area of the detector is also reduced, resulting in a smaller optical signal being detected, which is not desirable.

OBJECT OF THE INVENTION

Accordingly, it is an object of the present invention to provide an optoelectronic device and method of forming a light directing arrangement for the device with which the applicant believes the aforementioned disadvantages may at least be alleviated.

SUMMARY OF THE INVENTION

According to the invention there is provided an optoelectronic device comprising a body having a surface and a region of an indirect bandgap semiconductor material, a photon active region on one side of the surface, and a light directing arrangement adjacent an opposite side of the surface.

The photon active region may be at least one of a light emitting region and a light detecting region.

The indirect bandgap material may be one of Si, Ge and SiGe, but is not limited thereto. In one preferred embodiment, the material may be Si, the photon active region may comprise a pn-junction formed in the silicon material and the light directing arrangement may circumscribe a light transmitting zone on the surface. In other embodiments, other forms of photon active regions may be used, such as silicon nano-crystals embedded in a passivation layer, for example a layer of silicon dioxide, on a region or body of indirect bandgap material.

The light directing arrangement may be formed integrally on the surface, for example by using a standard CMOS process.

In some embodiments, the optoelectronic device may be a light emitting device wherein the pn junction, in use, is a light emitting source for transmitting light through the light transmitting zone towards the light directing arrangement.

In other embodiments the optoelectronic device may be a photodetector device wherein the pn junction, in use, is a photodetector for receiving light from the light directing arrangement through the light transmitting zone.

The light directing arrangement may comprise a structure of alternate layers of a light reflecting material and an insulating material forming a light reflecting sidewall defining a passage for light, which passage is in light communication relationship with the zone and wherein a transverse cross sectional area of the passage increases in a direction away from the zone.

The light reflecting material may be selected from a group comprising aluminium, copper, gold and polysilicon.

The sidewall may comprise exposed edges of the layers of a light reflecting material linked by annular regions of a light reflecting material cladding adjacent edges of the layers of the insulating material. The cladding light reflecting material may be the same as the material of the light reflecting layers.

At least some of the exposed edges and the annular regions may slope with an acute angle relative to a main axis of the passage. Preferably all the annular regions and the exposed edges slope relative to the main axis. In a preferred embodiment, the angle decreases in a direction away from the zone.

According to another aspect of the invention, there is provided a method of forming a light directing arrangement for an optoelectronic device comprising a body having a surface and a region of an indirect bandgap semiconductor material and a photon active region on one side of a surface, the method comprising the steps of forming at least one layer of a light reflecting material on an opposite side of the surface, to circumscribe a light transmitting zone on the surface and to define a passage for light.

The method may comprise the step of forming more than one superimposed layers of a light reflecting material to define the passage and spacing adjacent layers from one another by intermediate layers of an insulating material.

The method may comprise the step of cladding edges of the intermediate layers adjacent the passage with a light reflecting material.

The method may comprise the steps of providing at least some of the cladded edges and edges of the layers of a light reflecting material adjacent the passage with a slope at an acute angle relative to a main axis of the passage.

The arrangement may be formed by utilising conventional CMOS technology and depositing on the surface, a first of the layers of the light reflecting material, separating the first layer of a light reflecting material from a second of the layers of a light reflecting material by one of said intermediate layers, utilising a via definition to form a via between the first and second layers and to clad an edge of the intermediate layer adjacent the passage, and forming a slope for the via and edges of the layers of a light reflecting material respectively.

In one form of the method the slope for the via and the slopes for the layers of a light reflecting material may be arranged to provide the passage with a profile in the form of a parabola, an angle of the slope for the via and the slopes for the edges of the layers of a light reflecting material may be constant, and distances between a main axis of the passage and the slopes may be selected such as to minimize a difference between said angle and a tangent of the parabola at a corresponding location on the parabola.

In another form of the method, the slope for the via and the slope of the layers of a light reflecting material may also be arranged to provide the passage with a profile in the form of a parabola, but an angle of the slope for the via and respective angles for the edges of the layers of a light reflecting material may vary, so as to approach a tangent of the parabola at a corresponding location on the parabola.

BRIEF DESCRIPTION OF THE ACCOMPANYING DIAGRAMS

The invention will now further be described, by way of example only, with reference to the accompanying diagrams wherein.

Figure 7:
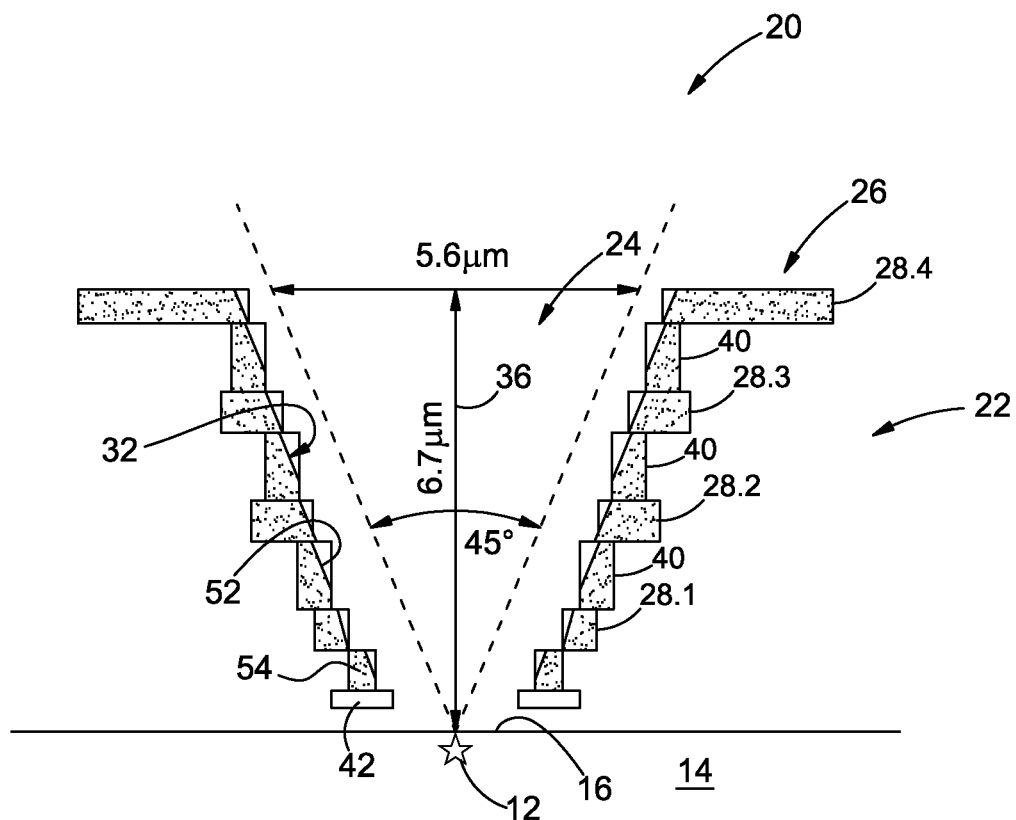
Figure 8:
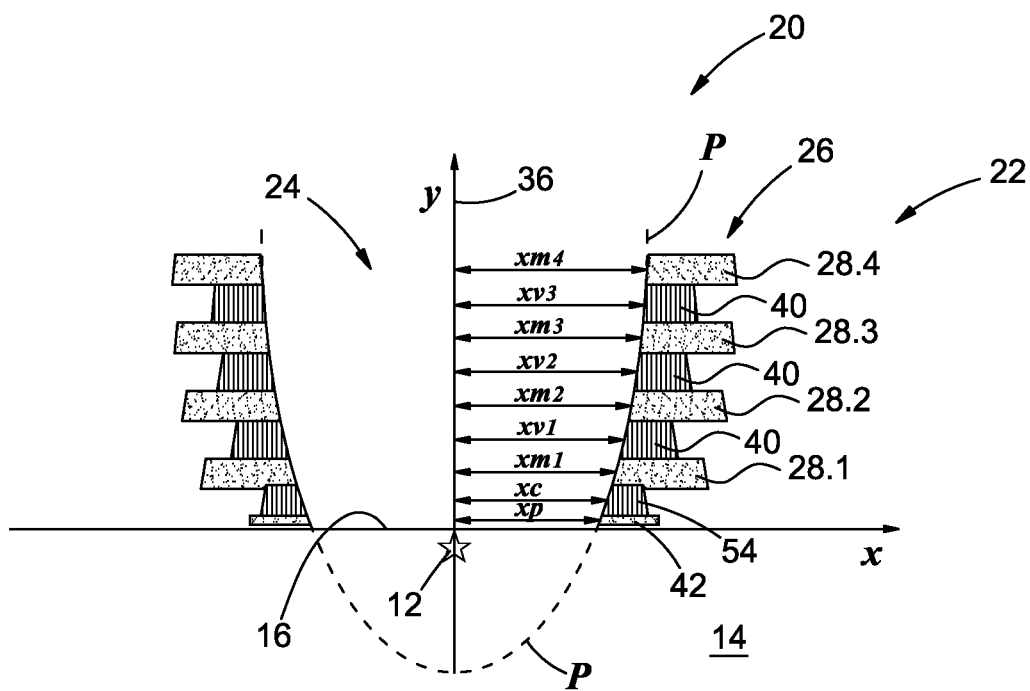
Figure 9:
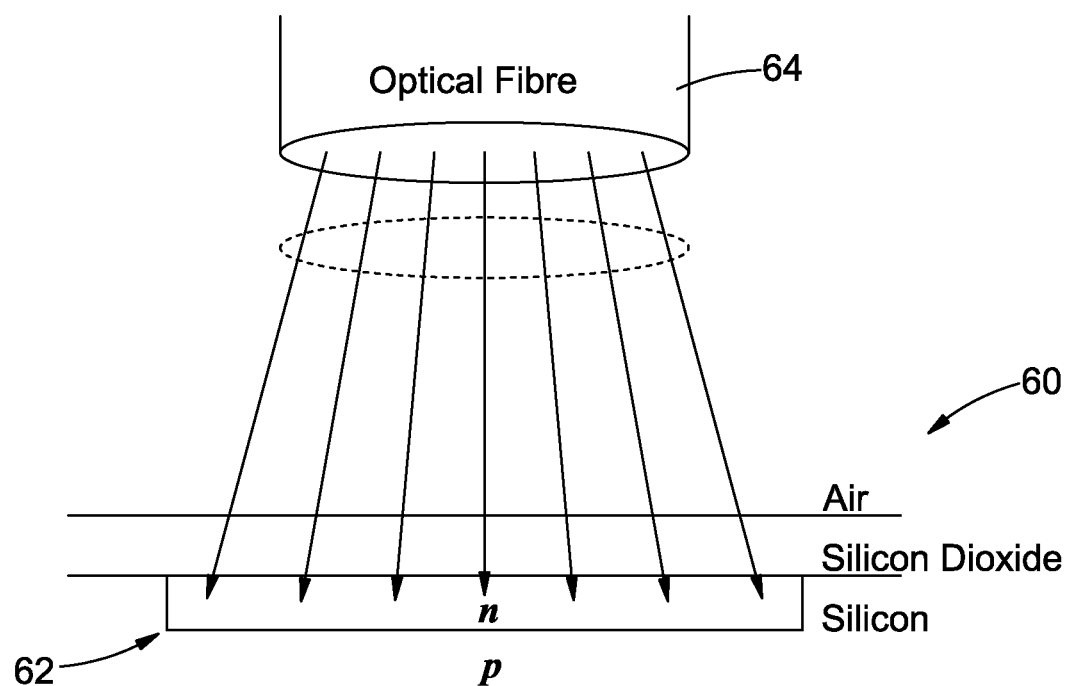

FIGS. 6(a) and (b) are views illustrating the formation of sloped surfaces on a sidewall of a passage for light defined by the structure;

FIG. 7 is a more detailed sectional view of the structure;

FIG. 8 is a diagrammatic illustration of another embodiment of the structure;

FIG. 9 is a diagrammatic representation of a prior art photodetector; and

Figure 10:
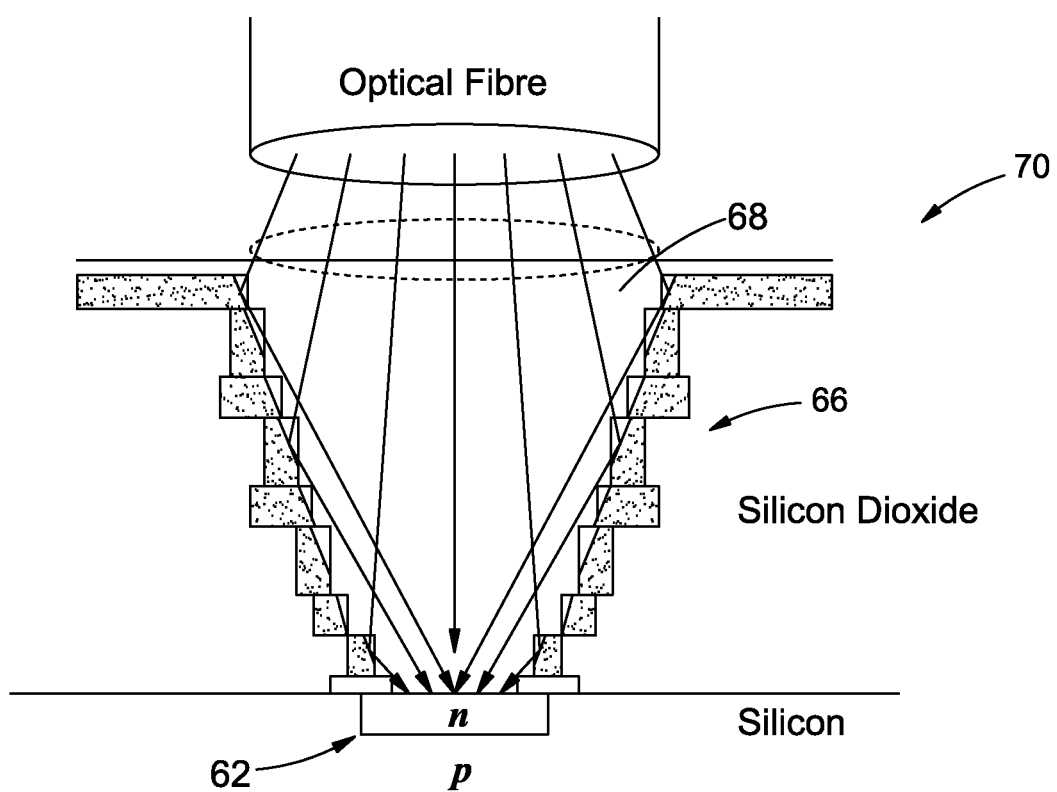

FIG. 10 is a diagrammatic sectional view through a second embodiment of an optoelectronic device according to the invention in the form of a photodetector comprising an impinging light directing arrangement.

DESCRIPTION OF A PREFERRED EMBODIMENT OF THE INVENTION

Figure 1:
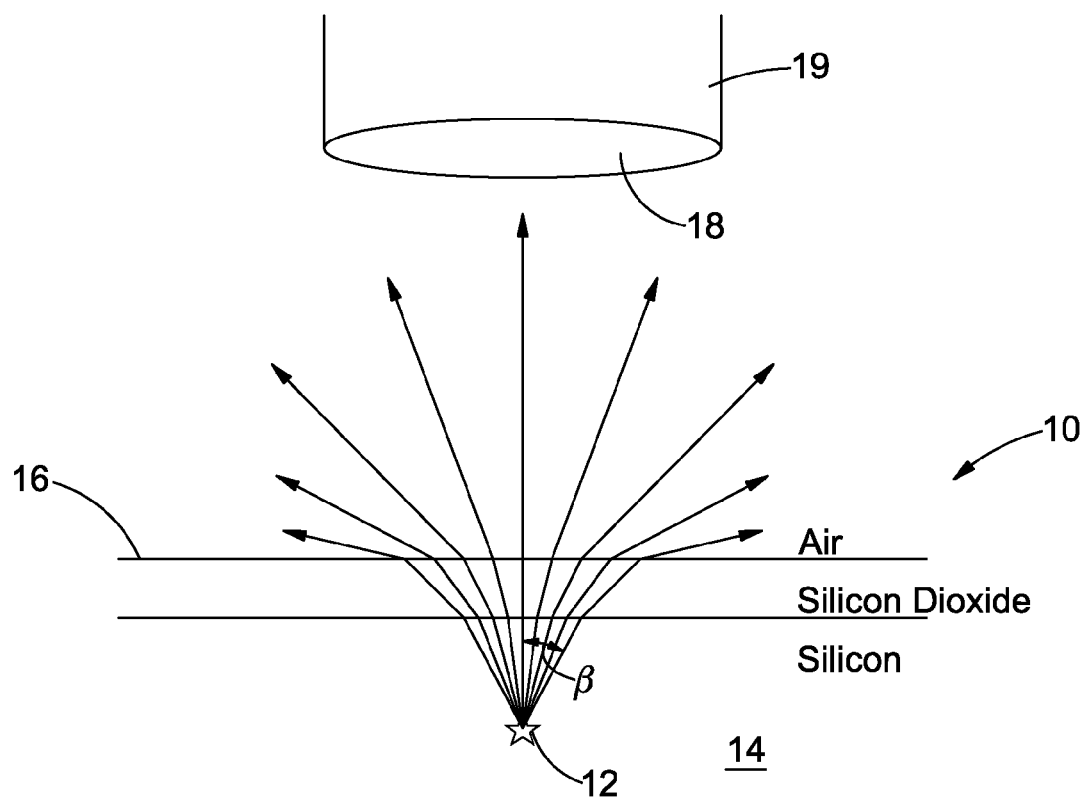
FIG. 1 is a diagrammatic representation of a prior art light emitting device comprising a light source in the form of a pn-junction in a body of silicon.

By way of background, a light radiation pattern of a known silicon light emitting device 10 is shown in FIG. 1. As stated in the introduction of this specification, the critical angle β of internal reflection at the silicon-oxide-air interface is only about 15.3°. As a result, only about 1.8% of the light generated at a junction 12 in the body of silicon 14 leaves the surface 16 of the body. A large proportion of that light leaves the surface in a direction substantially parallel to the surface 16 and therefore it is difficult to couple that light into an input 18 of a spaced optical fibre 19.

Figure 2:
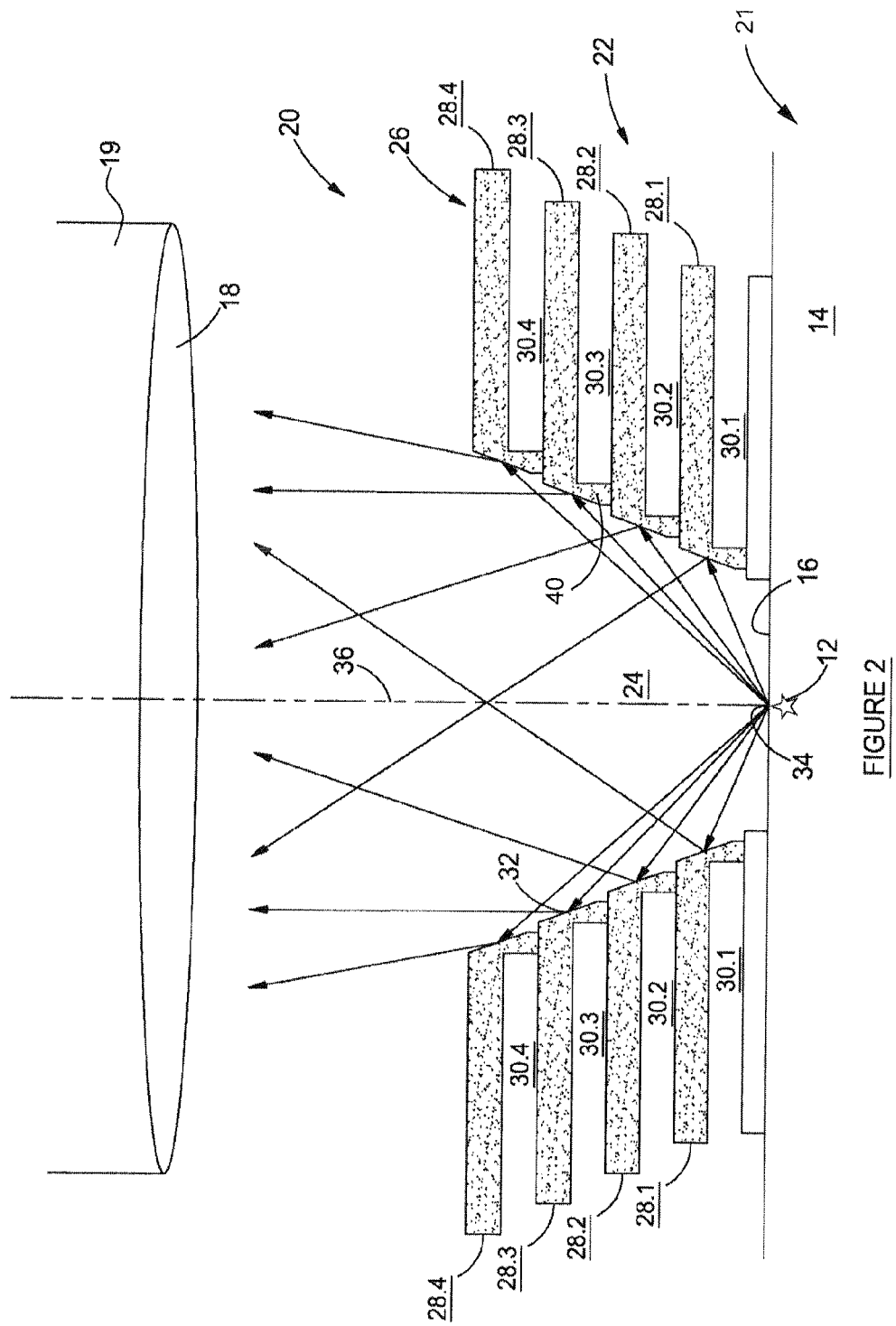
FIG. 2 is a diagrammatic sectional view through a first embodiment of an optoelectronic device according to the invention in the form of a light emitting device comprising an emitted light directing arrangement.

Referring to FIG. 2, an optoelectronic device according to the invention in the form of a light emitting device 20 comprises a body 21 having a surface 16 and a region 14 of an indirect bandgap material such as Si, Ge and SiGe, a light emitting source 12 on one side of the surface and an emitted light directing arrangement 22 adjacent an opposite side of the surface 16. The emitted light directing arrangement serves to focus the light along a passage 24, away from the surface, so that the light may more effectively be coupled into the input 18 of optical fibre 19.

In the embodiments shown in this specification, a passivation layer on the region 14 is not necessarily shown. It will be appreciated by those skilled in the art that a passivation layer may be provided and that the aforementioned surface would then be a surface of the layer remote from the region 14.

The emitted light directing arrangement is integrally formed on the aforementioned opposite side of the surface as will hereinafter be described in more detail. The arrangement 22 comprises a structure 26 of alternate layers 28.1 to 28.4 of a light reflecting material and layers 30.1 to 30.4 of an insulating material. The light reflecting material may be selected from a group comprising aluminium, copper, gold and polysilicon. The insulating material may be an oxide.

The structure 26 comprises a substantially cup shaped sidewall 32 circumscribing a light transmitting zone 34 on the surface 16. The wall 32 defines the passage 24 having a main axis 36 extending through the zone 34 and perpendicular to the surface. The passage 24 is in light communication relationship with the zone.

Figure 3:
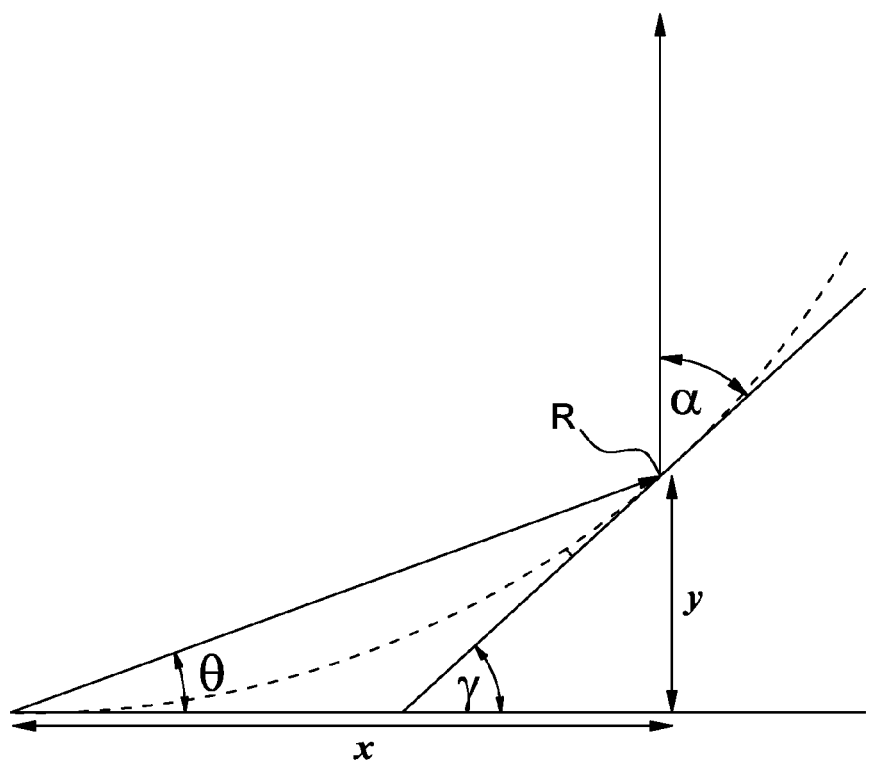
FIG. 3 is a diagram illustrating the relationship between certain dimensions and angles of one embodiment of the arrangement.

From FIG. 3 it is derived that at a reflection point R on the sidewall 32, the relationship between the angles is $$\gamma = 45 + \frac{\theta}{2} = \frac{90 + \theta}{2}$$

degrees
with the tangent of the structure at the point R given by $$\text{Slope} = \frac{dy}{dx} = \tan(\gamma) = \frac{\cos\theta}{1 - \sin\theta} = \frac{x}{\sqrt{x^2 + y^2} - y}$$

Using the above equations, the physical shape of the structure 26 at points on the wall 32 may be computed.

Figure 4:
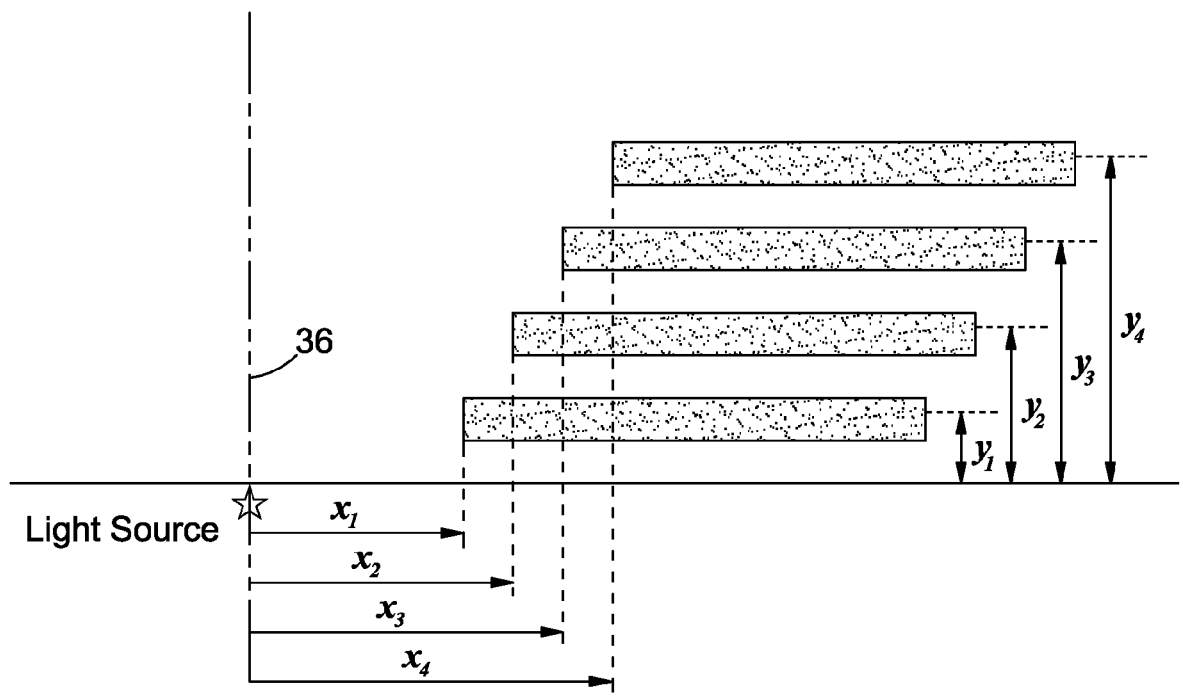
FIG. 4 is a diagrammatic view illustrating a plurality of light reflecting layers forming part of a emitted light directing structure.

In a standard CMOS technology, the metal conductor layers (normally aluminium) may be used to approximate the structure curvature. In the case where four metal layers 28.1 to 28.4 are present, the reflector structure will be as shown in FIG. 4. In the CMOS technology, the average heights $y_1$, $y_2$, $y_3$ and $y_4$ of the metal layer 28.1 to 28.4 above the surface 16 are fixed by the processing sequence. For each value of emission angle θ (see FIG. 3), the corresponding value of lateral dimension $x_n$, can be calculated for the given $y_n$. The top metal layer 28.4 determines the maximum emission angle to be reflected, depending on the application, and from this value of $x_n$ (n=4 in the example of FIG. 4) the other lateral dimensions $x_1$ to $x_3$ can be determined.

Figure 5:
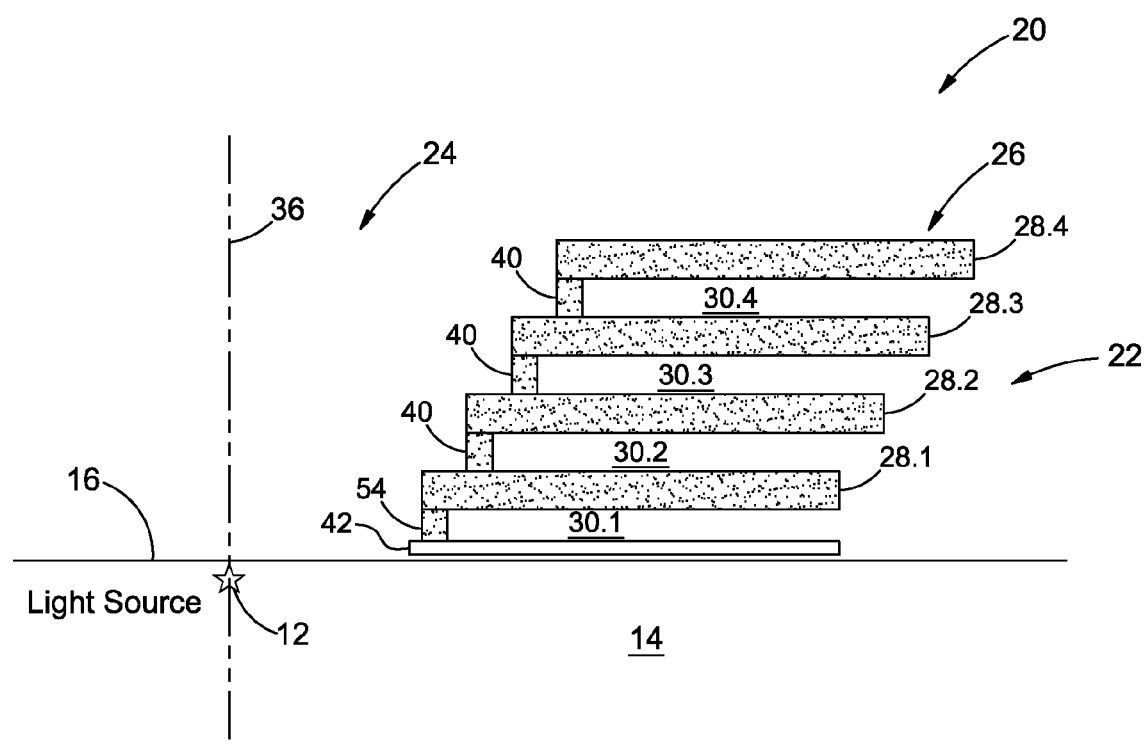
FIG. 5 is a more detailed sectional view of the structure.

Referring to FIG. 5, to increase the reflection area, and to prevent light from entering the oxide interfaces 30.1 to 30.4 between the metal layers 28.1 to 28.4, interconnect vias 40, which conventionally facilitate connections between adjacent metal layers, are used. In the structure 26 shown in FIG. 5, all layout rules are followed, that is, the metal layers 28.1 to 28.4 fully cover and fill the vias 40. In FIG. 5 an additional layer is used as reflective layer, namely a polysilicon layer 42. The metal layer 28.1 makes contact to the polysilicon layer 42 through a metal making contact 54.

To obtain an improved focussing action, the edges of the metal layers 28.1 to 28.4 adjacent the passage 24 and of the metal 40 filling the vias to clad the adjacent edges of isolation layers 30.1 to 30.4, may be given a slope.

In order to achieve a non-vertical slope of the reflecting surface, the CMOS layout rules may be violated. A rule to violate is the mask definition of the metal etch after via formation and metal deposition. Referring to FIG. 6(a), this may be done by causing the metal mask 50 not fully to cover the via definition 40, but only partially to cover the via in a region thereof away from the passage. This can be done, since no electrical function will be performed by the specific partially covered via, but only a mechanical/optical function.

Referring to FIG. 6(*b*), after the etching of the metal, the remaining metal will have a non-vertical slope 52 at an angle ε relative to the vertical or the axis 36 and will thus cause reflection of impinging light towards the vertical. It will be appreciated that the procedure described and illustrated with reference to FIGS. 6(*a*) and (*b*) could be used for all metal layers 28.1 to 28.4, as well as the metal making contact 54 to the polysilicon layer. The angle ε may decrease in a direction away from the surface 16.

In FIG. 7 the structure 22 resulting from the procedure hereinbefore described is shown. It is expected that in this case, much of the available optical signal will be directed substantially towards the vertical, but perhaps not in a narrow beam.

It will be appreciated that due to the relatively steep slope 52 of the metal edges, this structure may give better performance if the exit angle is small.

In FIG. 8, another embodiment of the structure 22 is shown. The structure defines a passage 24 with a profile substantially in the form of a parabola P and the light source 12 is at a focal point. Setting the focal point at the origin of the Cartesian coordinate system (0; 0), renders for the parabola $$y = ax^2 - 1/4a.$$

Some standard semiconductor processing technologies dictate fixed metal and via heights and a constant angle for the slopes on the inside edges of the layers forming the sidewall 32, which leaves as only design freedom, the horizontal distance x from the axis 36 to the inside edge of the layers.

FIG. 8 shows that the sloped inside edge of polysilicon layer 52, contact 54, metal layers 28.1 to 28.4 and via interconnect layers 40 can be aligned to the parabola P, so that they reflect rays from the light source 12 at the parabola's focus vertically upwards parallel to the parabola's axis of symmetry 36 passing through the focus.

Varying the parabola variable a and the distances xp, xc, xm1, xv1, xm2, xv2, xm3, xv3 and xm4 from the parabola's axis of symmetry 36, allows finding optimum distances such that a difference between the constant angle on the inside edge and a tangent of the parabola at a corresponding location on the parabola is minimized.

The above procedure is accomplishable while still keeping each metal edge further from the parabola's axis of symmetry 36 than the layer right underneath it (i.e. xp<xc<xm1<xv1<xm2<xv2<xm3<xv3<xm4).

The steeper the metal edges are, the larger the parabola variable a, and the narrower the parabola and resultantly exiting light beam will be.

In other embodiments, it may be possible to provide the inside edges of the layers with increasing slopes, in other words with decreasing angles ε (see FIG. 6(*b*)), so that the angles of the edges approach a tangent of the parabola at a corresponding location on the parabola. In such a case, the edges of the layers may be formed substantially to coincide with the tangent of the parabola at the relevant point.

The passage 24 may be filled with a translucent, preferably transparent material, such as silicon dioxide.

FIG. 9 shows a prior art or conventional photodetector 60, collecting light being emitted from an optical fibre 64. A relatively large pn junction area 62 is needed to collect a majority of the optical signal. As stated in the introduction of this specification, it is known that the speed with which semiconductor pn junction diode optical detectors operate, is a function of the built-in junction capacitance. By reducing the size of the detecting pn junction 62, the built-in pn junction capacitance can be reduced, and the detecting diode device can operate at a higher switching frequency. However, at the same time, the sensitive area of the detector is also reduced, resulting in a smaller optical signal being detected, which is not satisfactory.

Referring to FIG. 10, a light directing arrangement as hereinbefore described in the form of a collector 66 for impinging light is provided for the photodetector 70. Using the collector 66, the optical sensitive area 68 can still be fairly large, but the detector pn junction 62 can be made small. This means that substantially the same amount of optical energy can be detected at a larger operating frequency. More particularly, the integrated CMOS technology collector 66 concentrates substantially the same optical signal power onto a much smaller pn junction diode detector 62, resulting in a higher frequency of operation due to the smaller detector capacitance.

The invention claimed is:

1. A light emitting device comprising a body having a surface, a region of a semiconductor material and a light emitting source on one side of the surface, and an emitted light directing arrangement adjacent an opposite side of the surface for directing emitted light along a passage for light and away from the surface, the light directing arrangement comprising a structure of alternate layers of a light reflecting material and layers of an insulating material forming a light reflecting sidewall having a circular transverse cross-section and the passage for light having a main axis and wherein the sidewall comprises exposed edges of the layers of a light reflecting material adjacent to the passage and which are linked by regions of a light reflecting material cladding adjacent edges of the layers of an insulating material and wherein a distance from the main axis to the exposed edge of any one of the layers of a light reflecting material is not less than a distance from the main axis to the region cladding the adjacent edge of the layer of an insulating material immediately adjacent said one layer of a light reflecting material in a direction towards the surface.

2. The light emitting device as claimed in claim 1, wherein the light directing arrangement is formed integrally on the surface, wherein the layers of a light reflecting material comprise conductive metal layers and wherein the regions of a light reflecting material comprise metal interconnect vias for forming connections between spaced conductive metal layers.

3. The light emitting device as claimed in claim 1, wherein the semiconductor material is silicon, wherein the light emitting source comprises a pn junction formed in the region of a semiconductor material and wherein the light directing arrangement circumscribes a light transmitting zone on the surface.

4. The light emitting device as claimed in claim 3, wherein a transverse cross sectional area of the passage increases in a direction away from the zone.

5. The light emitting device as claimed in claim 1, wherein the light reflecting material is selected from a group comprising aluminium, copper, gold and polysilicon.

6. The light emitting device as claimed in claim 1, wherein the insulating material comprises an oxide.

7. The light emitting device as claimed in claim 1, wherein at least some of the exposed edges and the region cladding adjacent edges of the layers of an insulating material slope with an acute angle relative to a main axis of the passage.

8. The light emitting device as claimed in claim 7, wherein the angle decreases in a direction away from the zone.

9. The light emitting device as claimed in claim 2, wherein said distance from the main axis to the exposed edge of any one of the metal layers is larger than said distance from the main axis to the metal interconnect via cladding the adjacent edge of the layer of an insulating material immediately adjacent said one metal layer in a direction towards the surface, and wherein said one metal layer only partially covers the metal interconnect via.

10. The light emitting device as claimed in claim 1, wherein the passage has a profile in the form of a parabola and wherein the light emitting source is provided at a focal point of the parabola.

* * * * *